United States Patent [19]

Swann

[11] Patent Number: 5,753,924
[45] Date of Patent: May 19, 1998

[54] ULTRA-HIGH TILT SPECIMEN CRYOTRANSFER HOLDER FOR ELECTRON MICROSCOPE

[75] Inventor: Peter R. Swann, Pleasanton, Calif.

[73] Assignee: Gatan, Inc., Pleasanyton, Calif.

[21] Appl. No.: 815,685

[22] Filed: Mar. 12, 1997

[51] Int. Cl.[6] .................................................. H01J 37/20
[52] U.S. Cl. ................... 250/443.11; 250/442.11; 250/440.11
[58] Field of Search .................... 250/443.11, 442.11, 250/440.11

[56] References Cited

U.S. PATENT DOCUMENTS

| | | | |
|---|---|---|---|
| 4,227,080 | 10/1980 | Okura et al. | 250/442.11 |
| 4,591,722 | 5/1986 | Biddlecombe et al. | 250/443.1 |
| 4,672,797 | 6/1987 | Hagler | 53/467 |
| 4,703,181 | 10/1987 | Swann et al. | 250/442.11 |
| 4,797,261 | 1/1989 | Swann et al. | 422/102 |
| 4,950,901 | 8/1990 | Jones et al. | 250/443.11 |
| 5,039,864 | 8/1991 | Kondo | 250/442.11 |
| 5,367,171 | 11/1994 | Aoyama et al. | 250/443.11 |

OTHER PUBLICATIONS

Chalcroft et al., "A simply constructed extreme-tilt holder for the Philips eucentric goniometer stage", *J. Microscopy*, vol. 134, Apr. 1984, pp. 41–48.

*Primary Examiner*—Jack I. Berman
*Attorney, Agent, or Firm*—Killworth, Gottman, Hagan & Schaeff, L.L.P.

[57] ABSTRACT

An ultra-high tilt cryotransfer holder is provided which is capable of rotating a specimen through a full 360° tilt angle (180° from horizontal in both clockwise and counterclockwise directions) without spillage of cryogenic liquid, and while maintaining proper protection and cooling of the specimen. The cryotransfer holder includes a holder body having a specimen tip and a source of cooling for the specimen tip. The specimen tip includes a specimen grid of a thermally conductive material which has a plurality of grid openings between crossing grid bars. The grid may be extended from the holder into a forward viewing position or retracted into a protected position within a cryoshield.

14 Claims, 6 Drawing Sheets

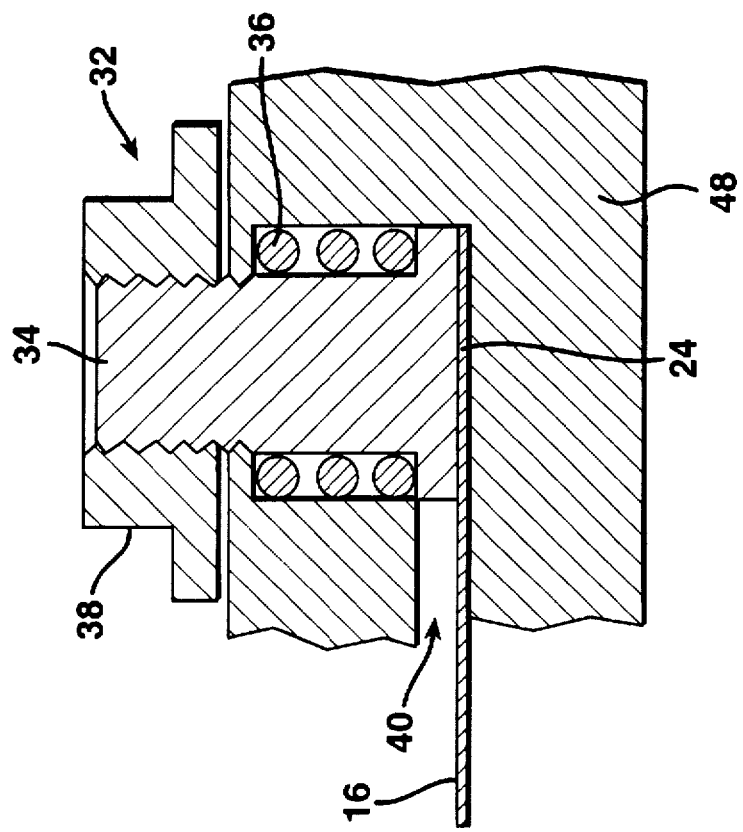
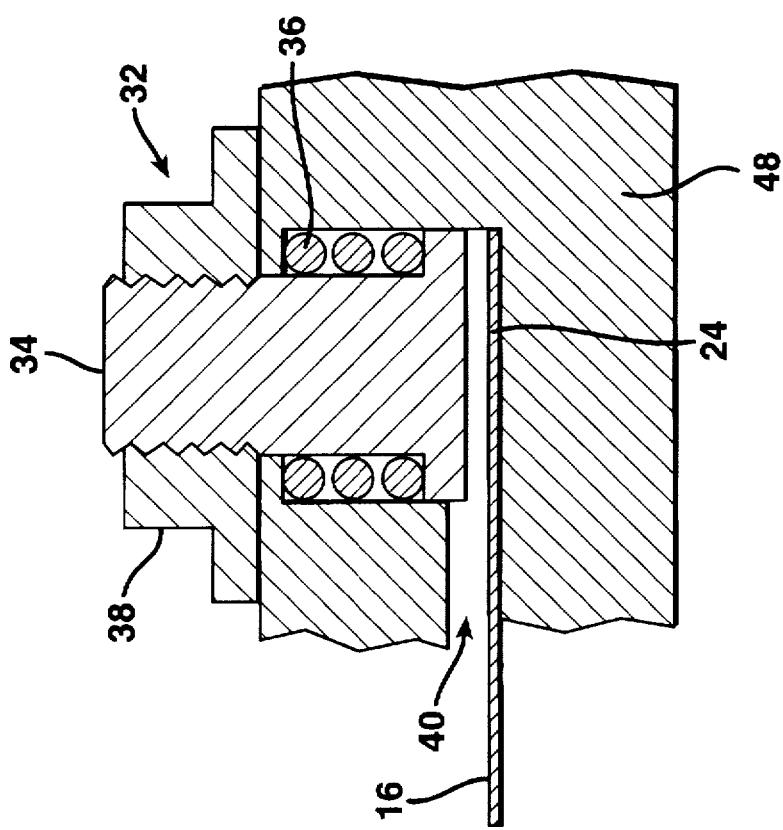

ULTRA-HIGH TILT SPECIMEN CRYOTRANSFER HOLDER FOR ELECTRON MICROSCOPE

BACKGROUND OF THE INVENTION

The present invention relates to specimen holders for transmission electron microscopes, and in particular to side-entry specimen cooling holders.

Electron microscope specimen holders may either take the form of a cartridge or a rod. Cartridge type holders are inserted vertically into the microscope through the upper polepiece of the objective lens, whereas rod type holders are inserted horizontally through the side of the microscope between the upper and lower polepieces. In recent years, rod type holders have become more widely used because mechanisms for tilting the specimen are simpler and more reliable. The ability to tilt a specimen is important for stereo imaging, three dimensional reconstruction, and tuning for optimum diffraction conditions.

One rod type specimen holder having the ability to be tilted up to 90° from the horizontal in both the clockwise and counterclockwise directions in an appropriate microscope is described by Chalcroft and Davey in *J. Microscopy* 134:41–48 (1984). There a specimen grid projecting beyond the end of a single tilt holder is clamped at one side by tweezers locked by a sliding collar. However, drawbacks to the design include operation at ambient temperatures rather than cryotemperatures, the lack of any shield or protection for the grid, the vulnerability of the unprotected grid to damage and contamination during specimen loading, insertion, and removal from the holder, and the need to select a grid having large areas unsupported by grid bars for maximum sample visibility.

Rod type specimen holders have also become the preferred type for observation of specimens at low temperatures. This is because the extraction of heat from the specimen is easily accomplished by forming the specimen tip of a thermally conductive material such as copper and extending the tip in the form of a copper rod to a dewar of liquid nitrogen or helium mounted at the other end of the rod. Cryotransfer holders are a more recent development of the rod type cooling holders in which specimens can be transferred at low temperature into the microscope from an external cryostation without frosting of the specimen.

Conventional resin embedding techniques for biological samples have been shown to produce readily identifiable artifacts that can be interpreted with reference to microstructural details in living cells. However, the water contained in the cells must be removed from samples during resin embedment, causing diffusion artifacts and the collapse of delicate cellular structures. To preserve the three-dimensional structure of living organisms during examination in the vacuum environment of an electron microscope, microscopists use ultra-rapid freezing techniques to prepare biological specimens for examination.

While such freezing techniques provide many advantages, several technical problems are presented and must be overcome. Specifically, the specimen must be rapidly frozen to promote the formation of amorphous ice. Also, once frozen, the specimen must be maintained at temperatures below about −130° C. at all times to prevent the formation of crystalline ice that would damage the structure of biological specimens. Typically, the frozen specimens are mounted on the cryotransfer holder in a special cryostation located near the electron microscope and then transferred quickly to the airlock of the microscope.

Cryotransfer holders of the type described in Swann et al, U.S. Pat. No. 4,703,181, have been developed which keep the specimens cold and prevent frost from forming on the specimen during the transfer of the holder from a specimen loading station into the microscope. Such holders include a close-fitting cryoshield associated with a liquid nitrogen dewar which can be moved into position to cover the specimen during transfer. Once inside the microscope, the shield can be retracted.

Three dimensional microscopic imaging, or electron tomography, involves the reconstruction of individual objects from projection data collected over a large range of specimen tilts. Practical limitations for electron tomography are set by the damage a specimen suffers with repeated irradiation by the electron beam and the range of tilt available in the specimen holder to generate projection data. By integrating electron microscope images of frozen biological specimens taken over a wide range of incremental tilt angles it is possible to determine the three dimensional structure of biomolecules and the surface topography of virus particles at resolutions approaching 0.5 nanometers.

In order to improve the resolution still further, it would be desirable to increase the range of available tilt angles beyond the current limit of about ±70°. This limit is due to mechanical constraints imposed by (a) the thickness of the specimen support frame at the specimen rod tip and (b) the grid bars of standard 3 mm diameter specimen support grids. Both features shadow the specimen from the electron beam at large tilt angles. In electron microscopes with small polepiece gaps, the tilt range may be further limited by mechanical interference between the specimen rod and the objective lens pole faces or the objective aperture. Finally, the tilt range may also be limited by the liquid nitrogen or helium spilling out of the rotated dewar mounted at the end of the specimen holder. Most researchers studying biomolecules, virus particles etc., in electron microscopes would find significant advantages if all of these mechanical constraints could be avoided.

Accordingly, there is still a need in this art for a specimen transfer holder which may be rotated through a wide range of angles while maintaining proper cooling of the specimen and without spillage of cryogenic liquid from a dewar.

SUMMARY OF THE INVENTION

The present invention meets that need by providing an ultra-high tilt cryotransfer holder which is capable of rotating a specimen through a full 360° tilt angle (180° from horizontal in both clockwise and counterclockwise directions) without spillage of cryogenic liquid, and while maintaining proper protection and cooling of the specimen. In accordance with one aspect of the present invention, an ultra-high tilt specimen cryotransfer holder is provided which includes a holder body having a specimen tip and a source of cooling for the specimen tip. The specimen tip includes a specimen grid of a thermally conductive material which has a plurality of grid openings between crossing grid bars.

To permit unobstructed viewing of the specimen on the grid, even at very high tilt angles, the openings in the grid between the grid bars each have a length (substantially perpendicular to the longitudinal axis of the holder body) which is greater than its width. A preferred ratio of grid opening length to width is approximately 5:1. The specimen tip is adapted to be rotated at least about 90° in both directions from horizontal, and in a preferred embodiment can be rotated ±180°.

Preferably, the specimen grid is secured to the specimen tip by a clamp which is operable even at cryogenic temperatures. The specimen grid includes a tab at a first end thereof, and the specimen tip includes a clamp which engages the tab. The clamp includes a clamp body, a spring urging the clamp body against the tab, and a nut threadably secured to the clamp body. Rotation of the nut either constricts the spring, permitting removal of the tab, or releases the spring to urge the clamp body against the tab on the specimen grid.

Preferably, the holder body also includes a cryoshield formed by an opening in the specimen holder tip and a mechanism for moving the specimen grid between an extended viewing position beyond the end of the specimen tip and a retracted position within the cryoshield. A preferred source for cooling the specimen tip comprises a vessel having first and second ends for containing a cryogenic liquid, the vessel being secured at a first end thereof to a rod in the holder body, and the vessel and the rod being rotatable about their respective horizontal axes. The vessel includes a generally horizontally oriented filler neck, preferably located at a second end thereof, and further includes an outer insulating body extending around the vessel.

Accordingly, it is a feature of the present invention to provide an ultra-high tilt cryotransfer holder which is capable of rotating a specimen through a full 360° tilt angle (180° from horizontal in both clockwise and counterclockwise directions) to permit unobstructed viewing of sample specimens. It is a further feature of the invention to provide a source of cooling the specimen which is operable during sample rotation without spillage of the cryogenic liquid, while maintaining proper protection and cooling of the specimen. These, and other features and advantages of the present invention, will become apparent from the following detailed description, the accompanying drawings, and the appended claims.

BRIEF DESCRIPTION OF THE DRAWINGS

FIGS. 7 and 8 are side views, in cross section, illustrating the operation of the clamp of the present invention.

DETAILED DESCRIPTION OF THE PREFERRED EMBODIMENT

Figure 1:
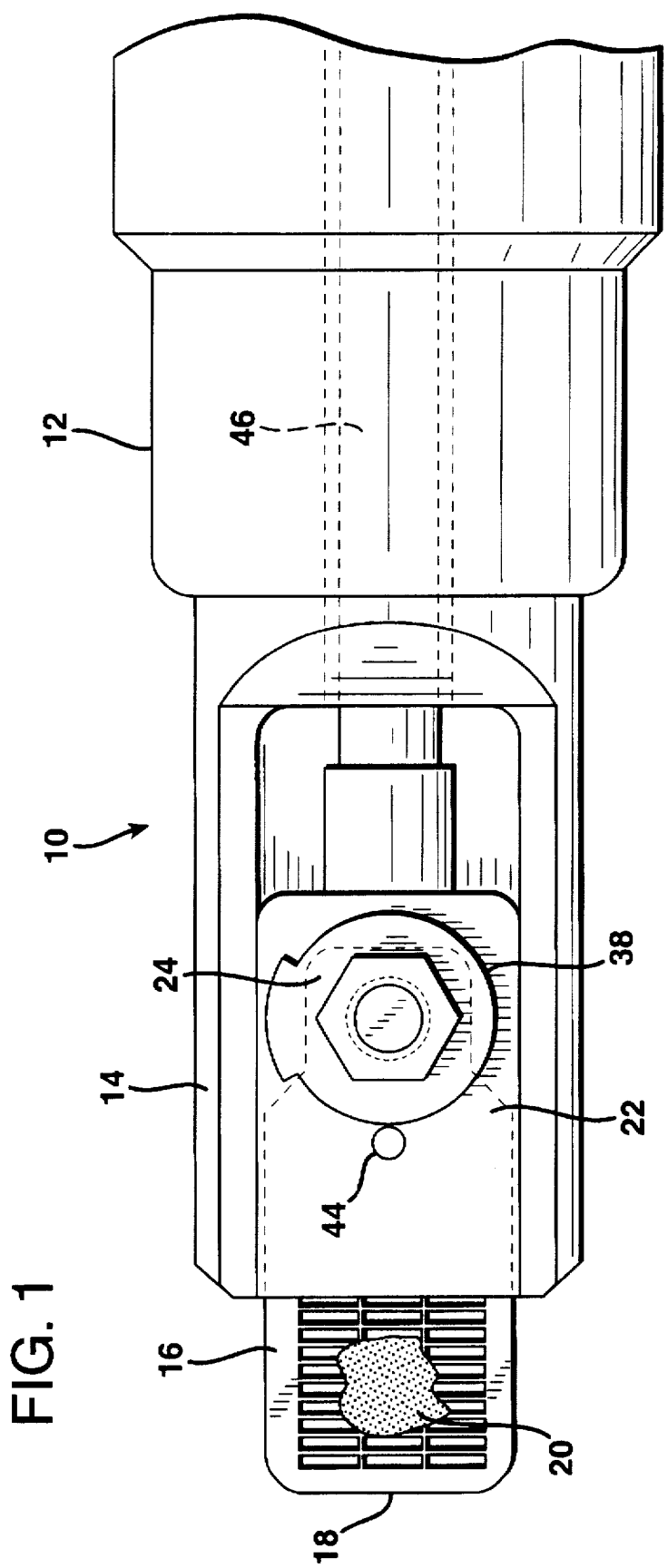
FIG. 1 is a top view of the transfer holder with the specimen grid in an extended, viewing position.

Referring now to FIG. 1, a top view of the cryotransfer holder of the present invention is illustrated. Specimen cryotransfer holder 10 includes a holder body 12 having a specimen tip 14. Tip 14 includes specimen support grid 16 which has a first end 18 for supporting a specimen 20 and a second end 22 including a tab portion 24 which is adapted to be secured to the specimen tip through a clamping arrangement.

Figure 5:
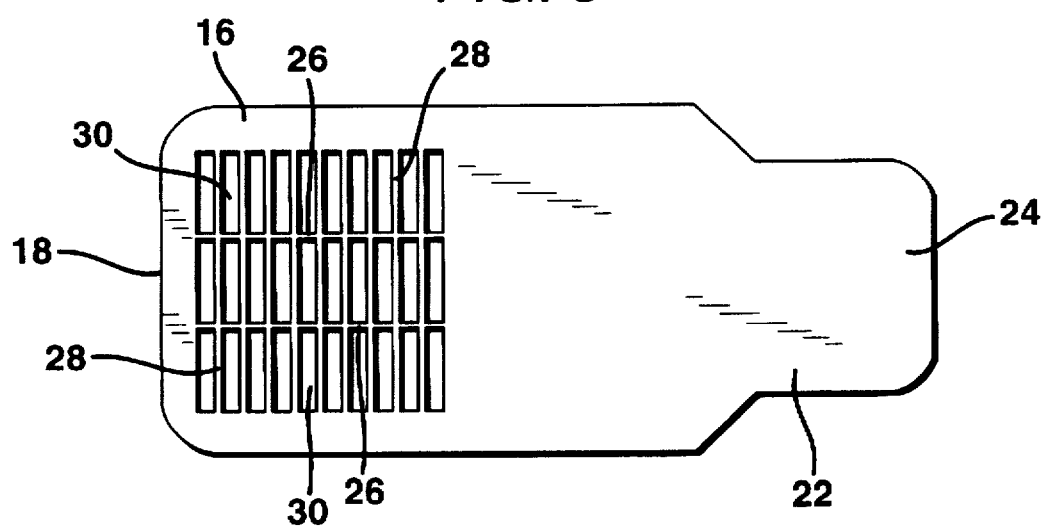
FIG. 5 is a detailed top view of the specimen grid.

Referring also now to FIG. 5, specimen support grid 16 at first end 18 includes a plurality of grid bars 26 and 28. As shown, grid bars 26 run substantially parallel to the longitudinal axis of the holder body, while grid bars 28 run substantially perpendicular to the longitudinal axis. Also as shown, the grid bars cross to form a plurality of grid openings 30. Grid 16 has no external support structure outside the boundary of the grid openings which would interfere with the ability of the specimen to be observed at high tilt angles.

The grid bars are positioned such that there is a relatively large spacing between adjacent grid bars 26. Preferably, the ratio of the length of a grid opening 30 to its width is approximately 5:1. Ratios smaller than this may obscure the specimen at high tilt angles, while larger ratios may render the mechanical strength of the grid too weak to support the specimen. The mechanical strength of grid 16 as shown is sufficient for the forces involved in specimen preparation and mounting at cryogenic temperatures including, for example, the techniques of cryomicrotome and cryoplunging.

By positioning the grid bars in this manner (i.e., a relatively large spacing of grid bars perpendicular to the specimen holder body long axis), the grid bars do not shadow the specimen at high tilt angles. By "shadow", I mean that the thickness of the bars would be in a direct line between the electron beam from the electron microscope and the specimen. Prior art specimen support frames and grid mesh arrangements cause specimen shadowing to occur at tilt angles of the specimen above about ±70° from horizontal.

Support grid 16 is preferably fabricated of a thermally conductive material such as electrodeposited copper. Typical dimensions for grid 16 are a width of less than about 3 mm, a length of approximately 6.5 mm and a thickness of approximately 20–50 μm. The less than 3 mm width is designed to permit the grid to rotate freely between the upper and lower pole pieces in an electron microscope. The width of grid bars 26, 28 is approximately 0.05–0.06 mm, the spacing between bars 26 is approximately 0.70 mm, and the spacing between bars 28 is approximately 0.15 mm.

Grid 16 is secured to specimen holder body 12 using a clamping arrangement which is best illustrated in FIGS. 1, 2, 7, and 8. Clamping mechanism 32 includes a clamp body 34, a spring 36, and a threaded nut 38. To load specimen grid 16 into the tip 14 of holder body 12, the second end 22 is inserted through a slot 40 in specimen tip holder 14 (best seen in FIG. 4) which forms a cryoshield for the specimen. There, tab 24 seats into clamping mechanism 32. Clamping mechanism 32 is initially in the position shown in FIG. 7, with nut 38 holding spring 36 in a compressed position. Rotation of threaded nut 38, as shown in FIG. 8, releases spring 36 which forces clamp body 34 down onto tab 24, securing the grid. Nut 38 is constrained by end stop 44 to rotate less than one turn.

Securing grid 16 to the holder body 12 is preferably performed at low temperature in a cryostation. Nut 38 may be adjusted using a long, thin-walled socket wrench (not shown) which allows the specimen 20 and grid 16 to be clamped even when specimen tip 14 is immersed in a cryogenic environment such as liquid nitrogen.

Figure 2:
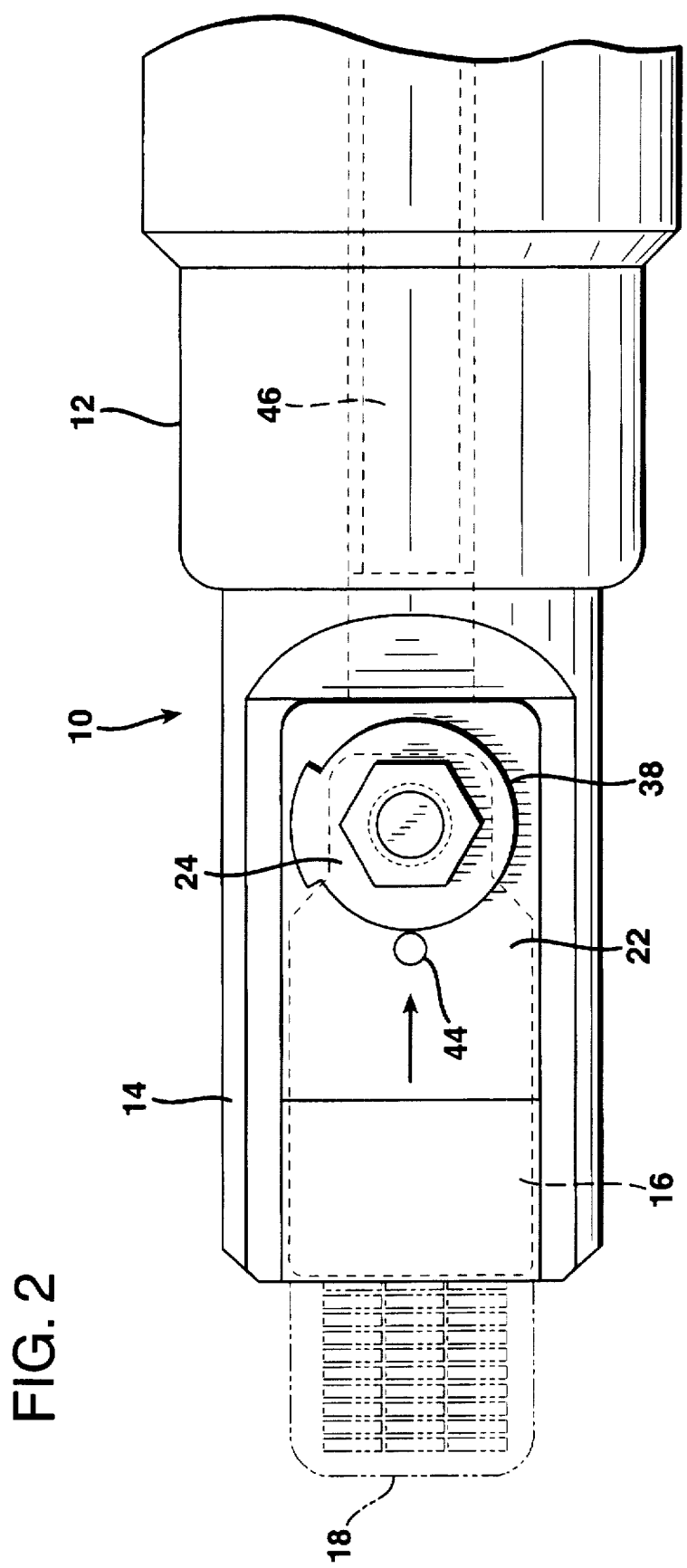
FIG. 2, similar to FIG. 1, is a top view of the transfer holder with the specimen grid in a retracted position.

FIG. 2 illustrates a top view of cryotransfer holder 10 with the specimen grid 16 in a retracted (protected) position. Grid 16 is moved from its extended to retracted position by a drawbar 46 which extends along the longitudinal axis of holder body 12. Drawbar 46 may be operated using any of electric, hydraulic, or pneumatic drivers (not shown) positioned outside the electron microscope. When grid 16 is retracted, it enters slot 40 in specimen tip holder 14 which acts as a cryoshield to maintain grid 16 at cryogenic temperatures. This protects the specimen 20 from frosting while the holder is transferred from a cryostation through a laboratory environment to the electron microscope.

Figure 3:
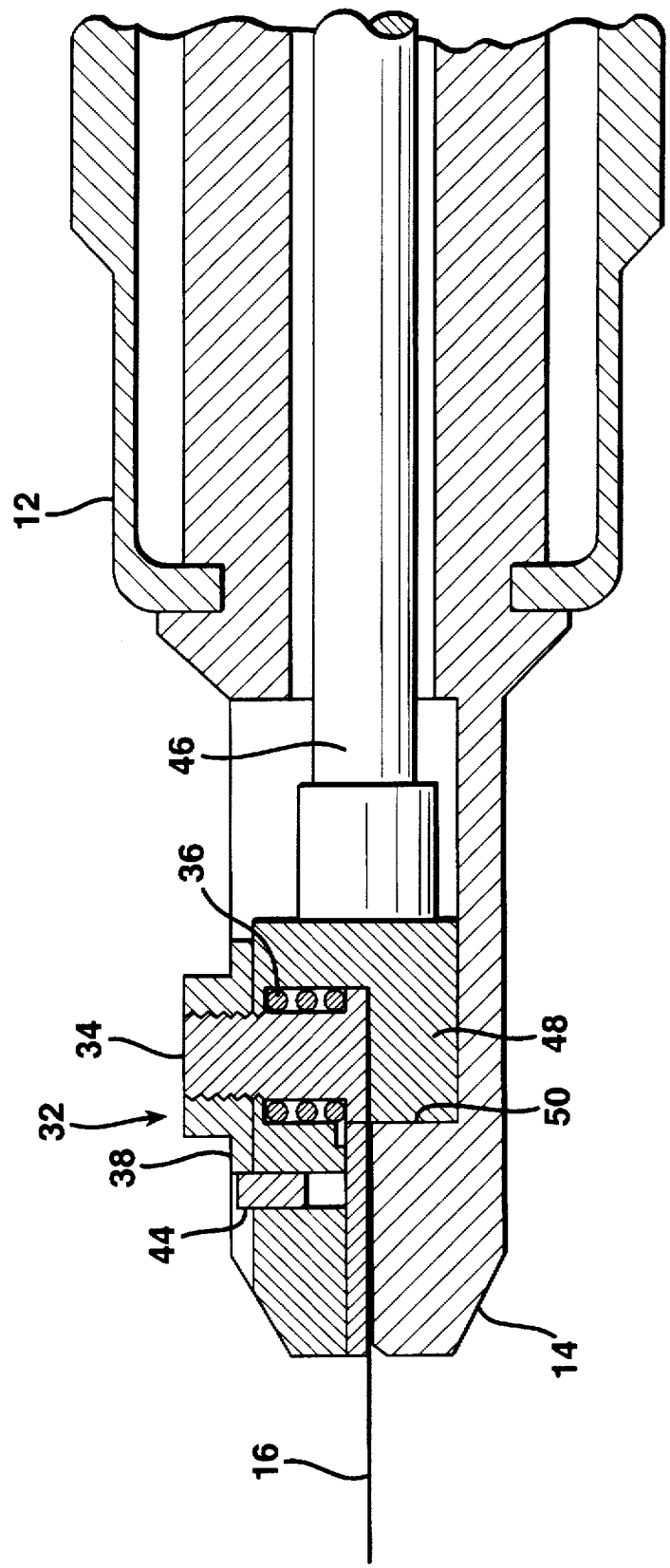
FIG. 3 is a side view, in cross section, of the specimen transfer holder, with the specimen grid in an extended, viewing position.

FIG. 3 is a side view, in cross section, of specimen tip holder 14 and holder body 12 illustrating specimen grid 16 clamped by clamping mechanism 32. Clamping nut 38 is turned into its fully counterclockwise position so that spring 36 forces clamp body 34 against the tab on the end of the specimen grid. In this view, drawbar 46 has extended specimen carrier 48 to an extended position against a shoulder 50 in specimen tip holder 14. Specimen grid 16 is in an extended forward viewing position. Also as shown, specimen tip holder 14 extends longitudinally within holder body 12 toward the dewar (not shown in FIG. 3, but shown in FIG. 6). Preferably, the specimen tip holder is fabricated of a thermally conductive material such as copper and communicates with the dewar to provide cryogenic cooling to the specimen.

Figure 4:
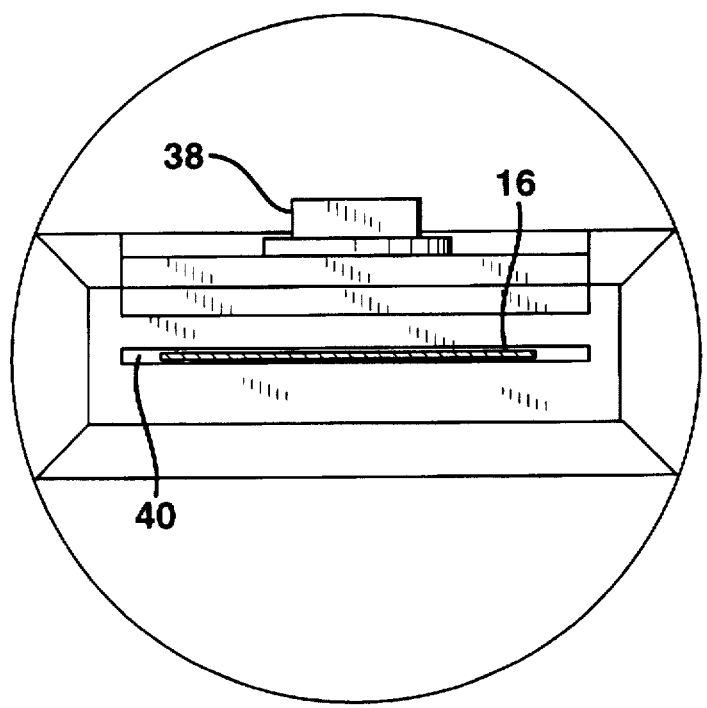
FIG. 4 is an end view of the specimen tip and grid retracted into a cryoshield formed by an opening in the specimen holder tip.

Moving drawbar 46 to the right (from the perspective shown in FIG. 3) retracts specimen grid 16 through a slot 40 in specimen tip holder 14. Thus, the specimen tip holder acts as a cryoshield for the specimen and grid. FIG. 4 illustrates slot 40 with grid 16 contained therein. As specimen tip holder 14 is fabricated of a thermally conductive material and is in communication with the cryogenic liquid in the dewar, specimen 20 becomes completely surrounded by material at cryogenic temperatures. The clearance in slot 40 between the walls of the specimen tip holder 14 and specimen 16 is designed to be small enough to prevent any significant convection of gas over the specimen when it is at atmospheric pressure and to be less than the mean free path between gas molecules at when the specimen is in the microscope airlock vacuum. This allows the specimen to be protected from frosting throughout the time the cryoholder is exposed to moist air during transfer between the specimen loading station and the microscope vacuum.

Figure 6:
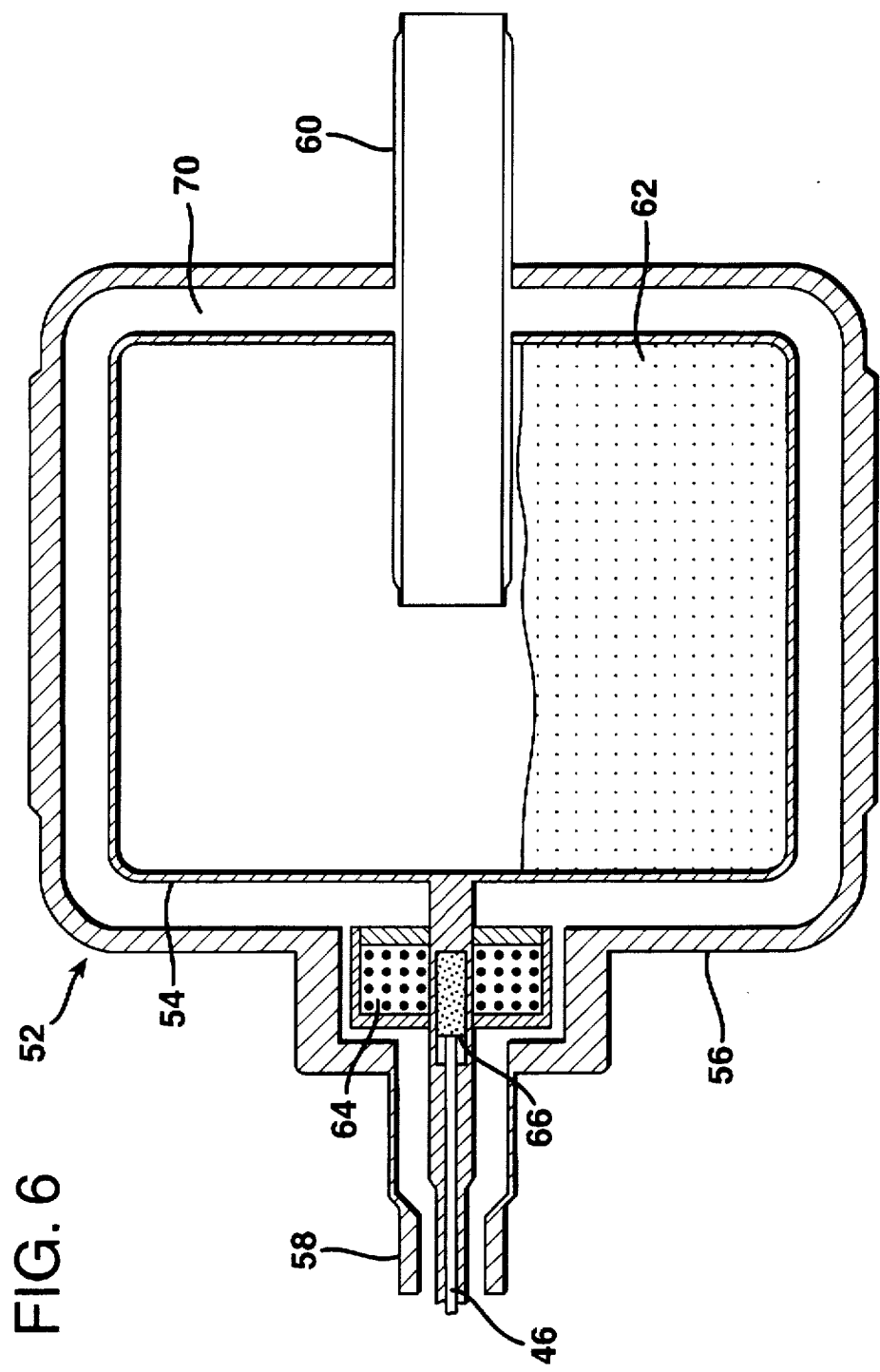
FIG. 6 is a side view, in cross section, of the rotatable, cryogenic liquid-containing vessel.

The dewar or vessel for containing the cryogenic coolant for the specimen is illustrated in cross section FIG. 6. As shown, vessel 52 is adapted for rotation about a horizontal axis and includes an inner wall 54 and an outer wall 56. At a first end thereof, the inner wall 54 of the dewar is connected to the opposite end of drawbar 46. A thermally conductive material 58 surrounds drawbar 46 and communicates with specimen tip holder 14. At a second end of vessel 52 is a horizontally-oriented neck 60 through which the dewar may be filled with a cryogenic liquid such as, for example, liquid nitrogen 62.

Because of the positioning and orientation of neck 60, there is no spillage of cryogenic liquid when the cryotransfer holder is rotated, even through a complete ±180° tilt. Rather, the cryogenic liquid flows freely so that it is maintained in the lower half of the vessel. Further, the cryogenic fluid cools the inner wall 54 of the dewar, and this cooling is conducted along thermally conductive material 58 to the specimen. The inner wall 54 is insulated from the outer wall 56 by an evacuated space 70.

Drawbar 46 may be actuated manually to extend or retract specimen grid 16, or, as shown schematically in FIG. 6, it may be actuated electromagnetically. When solenoid 64 is energized by an electrical current source (not shown), the cylindrical electromagnet 66 attached to one end of drawbar 46 will move specimen grid 16 either into or out of the cryoshield depending upon the polarity of the magnet and the direction of electric current in the through the solenoid coil.

The cryotransfer holder of the present invention may be used to study specimens prepared in a cryoultramicrotome or by rapid freezing of liquid suspensions. In both preparation techniques, the specimen is placed on the specimen grid and held there by the amorphous ice which forms around it at cryogenic temperatures. The mounted specimen may then be transferred at cryogenic temperatures to a specimen grid loading station in a liquid nitrogen filled capsule of a type commercially available from Gatan, Inc. of Pleasanton, Calif.

The grid 16, with specimen 20 thereon, is then removed from the capsule and placed on a horizontal support platform aligned with the tip 14 of the cryotransfer holder. In this position, grid 16 may be slid into slot 40 in the specimen tip holder 14, and tab 24 secured therein by clamping mechanism 32. This loading and clamping operation may also be carried out at cryogenic temperatures.

After loading and securing of the specimen grid, drawbar 46 is actuated briefly to retract the grid within slot 40 and into the cryoshield which is formed by the specimen tip. With the specimen in this retracted position, the cryotransfer holder of the invention may then be withdrawn from the specimen grid loading station and transferred quickly into an electron microscope. When the holder is under the vacuum in the microscope, solenoid 64 is again briefly actuated to extend grid 16 into its forward viewing position.

While certain representative embodiments and details have been shown for purposes of illustrating the invention, it will be apparent to those skilled in the art that various changes in the methods and apparatus disclosed herein may be made without departing from the scope of the invention, which is defined in the appended claims. For example, the solenoid-actuated transfer mechanism could be replaced by a manual mechanism. Additionally, the transfer holder could be adapted for use under ambient conditions, and the specimen could be secured to the grid by using a plastic grid which was electrically charged.

What is claimed is:

1. A specimen cryotransfer holder for an electron microscope comprising:

a holder body having a specimen tip, said specimen tip including a specimen grid of a thermally conductive material, said specimen grid having a plurality of grid bars which cross to form grid openings, said grid openings each having a length substantially perpendicular to the longitudinal axis of said holder body which is greater than the width of said opening, said specimen tip adapted to be rotated at least about 90° in both directions from horizontal; and a source of cooling for said specimen tip.

2. A specimen cryotransfer holder as claimed in claim 1 in which said specimen grid is secured to said specimen tip by a clamp.

3. A specimen cryotransfer holder as claimed in claim 2 in which said specimen grid includes a tab at a first end thereof and said specimen tip includes a clamp which engages said tab.

4. A specimen cryotransfer holder as claimed in claim 3 in which said clamp includes a clamp body, a spring urging said clamp body against said tab, and a nut threadably secured to said clamp body.

5. A specimen cryotransfer holder as claimed in claim 1 in which said holder body includes a cryoshield and a mechanism for moving said specimen grid between an extended viewing position beyond the end of said specimen tip and a retracted position within said cryoshield.

6. A specimen cryotransfer holder as claimed in claim 1 in which source for cooling said specimen tip comprises a vessel having first and second ends for containing a cryogenic liquid, said vessel being secured at a first end thereof to a rod in said holder body, said vessel and said rod being rotatable about their respective horizontal axes.

7. A specimen cryotransfer holder as claimed in claim 6 in which said vessel includes a generally horizontally oriented filler neck located at a second end thereof.

8. A specimen cryotransfer holder as claimed in claim 6 in which said vessel further includes an outer insulating body extending around said vessel.

9. A specimen cryotransfer holder for an electron microscope comprising:

a holder body having a specimen tip, said specimen tip including a specimen grid of a thermally conductive material; and a source of cooling for said specimen tip, said source of cooling comprising a vessel having first and second ends for containing a cryogenic liquid, said vessel being secured at a first end thereof to a rod in said holder body with said rod communicating with said specimen tip, said vessel and said rod being rotatable about their respective horizontal axes.

10. A specimen cryotransfer holder as claimed in claim 9 in which said specimen grid has a plurality of grid openings, said openings each having a length substantially perpendicular to the longitudinal axis of said holder body which is greater than the width of said opening, said specimen tip adapted to be rotated at least about 90° in both directions from horizontal.

11. A specimen cryotransfer holder as claimed in claim 9 in which said holder body includes a cryoshield and a mechanism for moving said specimen grid between an extended viewing position beyond the end of said specimen tip and a retracted position within said cryoshield.

12. A specimen cryotransfer holder for an electron microscope comprising:

a holder body having a specimen tip, said specimen tip including a specimen grid of a thermally conductive material, said specimen grid including a tab at a first end thereof, said specimen tip further including a clamp which engages said tab; and a source of cooling for said specimen tip.

13. A specimen cryotransfer holder as claimed in claim 12 in which said clamp includes a clamp body, a spring urging said clamp body against said tab, and a nut threadably secured to said clamp body.

14. A specimen cryotransfer holder as claimed in claim 12 in which said holder body includes a stationary cryoshield and a movable mechanism for moving said specimen grid between an extended viewing position beyond the end of said specimen tip and a retracted position within said cryoshield.

* * * * *